US008759670B2

(12) United States Patent
Furusawa

(10) Patent No.: US 8,759,670 B2
(45) Date of Patent: Jun. 24, 2014

(54) PHOTOVOLTAIC CONVERTER DEVICE AND ELECTRONIC DEVICE

(75) Inventor: Masahiro Furusawa, Chino (JP)

(73) Assignee: Seiko Epson Corporation (JP)

( * ) Notice: Subject to any disclaimer, the term of this patent is extended or adjusted under 35 U.S.C. 154(b) by 362 days.

(21) Appl. No.: 12/715,567

(22) Filed: Mar. 2, 2010

(65) Prior Publication Data
US 2010/0224244 A1 Sep. 9, 2010

(30) Foreign Application Priority Data

Mar. 4, 2009 (JP) ................................ 2009-050922

(51) Int. Cl.
H01L 31/00 (2006.01)
(52) U.S. Cl.
USPC ............... 136/258; 136/256; 438/93; 257/53; 257/E31.048
(58) Field of Classification Search
USPC ........ 136/256, 258; 257/53, E31.048; 438/93
See application file for complete search history.

(56) References Cited

U.S. PATENT DOCUMENTS

2006/0040103 A1* 2/2006 Whiteford et al. ............ 428/403
2007/0137693 A1 6/2007 Forrest
2008/0029153 A1* 2/2008 Margalit ........................ 136/252
2008/0230782 A1* 9/2008 Antoniadis et al. ............. 257/53
2008/0251116 A1 10/2008 Green

FOREIGN PATENT DOCUMENTS

JP 2007-535806 12/2007
WO WO2005-106966 11/2005

OTHER PUBLICATIONS

Lai, "Interface trap generation in silicon dioxide when electrons are captured by trapping holes", Journal of Applied Physics, 1983.*
"Semiconductor Band Gaps" from http://hyperphysics.phy-astr.gsu.edu/hbase/tables/semgap.html, citing Kittle, Introduction to Solid State Physics, 6th Ed., 1986.*

* cited by examiner

Primary Examiner — Matthew Martin
(74) Attorney, Agent, or Firm — Harness, Dickey & Pierce, P.L.C.

(57) ABSTRACT

A photovoltaic converter device includes a photovoltaic conversion layer containing a plurality of nanoparticles in a first material in a dispersed state, wherein the nanoparticles include a second material in particles and a third material that coats the second material, the third material having a band gap E3 that is greater than a band gap E1 of the first material, and greater than a band gap E2 of the second material.

14 Claims, 14 Drawing Sheets

| Core | Shell | Matrix layer |
|---|---|---|
| a-Si,c-Si,c-Ge,a-Ge, PbS,PbSe, GaAs,ZnSe, β-GeSi$_2$ β-FeSi$_2$ | SiO$_2$,SiN, SiON, SiC,GaN, ITO,FTO,ATO, ZnO,SnO$_2$ | a-Si,c-Si |

FIG. 13

PHOTOVOLTAIC CONVERTER DEVICE AND ELECTRONIC DEVICE

The entire disclosure of Japanese Patent Application No. 2009-050922, filed Mar. 4, 2009 is expressly incorporated by reference herein.

BACKGROUND

1. Technical Field

The present invention relates to photovoltaic converter devices and, in particular, to photovoltaic converter devices that use nanoparticles.

2. Related Art

As clean energy sources that contribute to energy conservation and resource saving, solar cells (i.e., photovoltaic converter devices) are being actively developed. Solar cells are electric power devices that use the photo-electromotive force effect to directly convert light energy to electric power. As their structures, various kinds of structures, such as, organic thin film solar cells, dye-sensitized solar cells, solar cells with multi-junction structure, and the like are being investigated. Above all, solar cells that use quantum dots (nanoparticles) are attracting attention as the next-generation solar cells that make it possible in theory to achieve the conversion efficiency higher than 60%.

For example, Published Japanese translation of a PCT application 2007-535806 (Patent Document 1) describes a solar cell having a plurality of crystalline semiconductor material quantum dots that are separated mutually by dielectric material thin layers.

However, with the structure using silicon as the quantum dots that are examined in detail in the above-mentioned Patent Document 1 and silicon oxide as the dielectric material thin layers, it is feared that charge (electrons) cannot be effectively retrieved from the quantum wells. The above-mentioned Patent Document 1 examines that, according to the super lattice structure described therein, mini-bands are formed so that charges (electrons) can be efficiently retrieved.

However, arranging the super lattice structure, a highly advanced technology is necessary to arrange devices with super lattice structure, in other words, quantum dots. Moreover, in order to form mini-bands, variations in the particle size need to be less than 10% for quantum dots of several nm~several ten nm in diameter, which makes it extremely difficult.

SUMMARY

In view of the above, it is an object, in accordance with a concrete embodiment of the invention, to provide a photovoltaic converter device with favorable characteristics. In particular, it is an object to improve the characteristics of a photovoltaic converter device by using nanoparticles (quantum dots) in which their core portions in the form of particles are coated by shell portions.

A photovoltaic converter device in accordance with an aspect of the invention pertains to a photovoltaic converter device having a photovoltaic conversion layer containing a plurality of nanoparticles in a first material in a dispersed state, wherein the nanoparticles include a second material in particles and a third material that coats the second material, the third material having a band gap $E3$ that is greater than a band gap $E1$ of the first material, and greater than a band gap $E2$ of the second material.

According to such a structure, the band gap of the third material that coats the second material forms a quantum well, and charges within the quantum well can be readily retrieved by tunneling through the third material. Accordingly, the photovoltaic converter device is provided with high photovoltaic conversion efficiency.

For example, the first material and the second material may be semiconductor. Also, for example, the third material may be dielectric. By selecting such materials, a photovoltaic converter device that meets the relation among $E1$ through $E3$ described above can be provided.

For example, the second material may be any one of Ge, PbS and PbSe. Also, for example, the first material may be amorphous silicon or crystalline silicon. Also, for example, the third material may be silicon oxide. By selecting these materials, a photovoltaic converter device that meets the relation among $E1$ through $E3$ described above can be obtained.

For example, materials may be selected such that the second material has an absorption coefficient greater than an absorption coefficient of the first material. By selecting such materials, light absorption probability within nanoparticles becomes greater, and the photovoltaic conversion efficiency can be further improved.

For example, the photovoltaic converter device described above may further include a p-type semiconductor layer and an n-type semiconductor layer, and has the semiconductor layer between the p-type semiconductor layer and the n-type semiconductor layer. In this manner, a pin type photovoltaic converter device may be provided through providing the semiconductor layer between a p-type semiconductor layer and an n-type semiconductor layer.

An electronic apparatus in accordance with another aspect of the invention includes any one of the photovoltaic converter devices described above. According to such a structure, the characteristics of the electronic apparatus can be improved.

BRIEF DESCRIPTION OF THE DRAWINGS

FIG. 13 shows a table of examples of materials that can be used as a core material, a shell material and a matrix material of the photovoltaic converter device in accordance with the present embodiment.

DESCRIPTION OF EXEMPLARY EMBODIMENTS

Preferred embodiments of the invention are described in detail below with reference to the accompanying drawings. It is noted that components having the same function shall be appended with the same or related reference numbers, and their description shall not be repeated.

Structure of Photovoltaic Converter Device>

Figure 1:
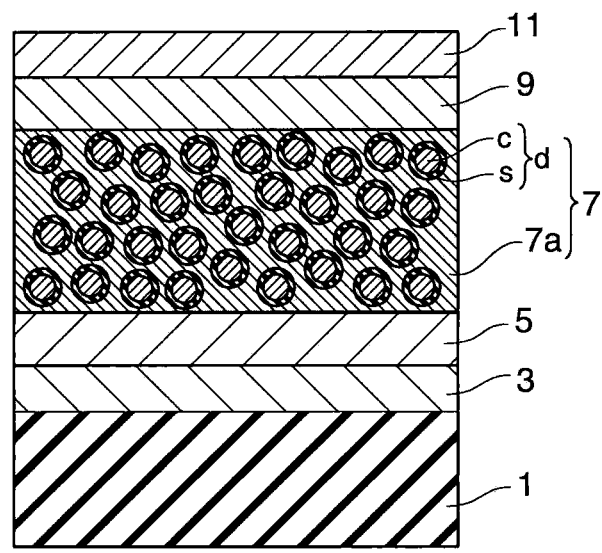
FIG. 1 is a cross-sectional view showing the structure of a quantum dot type photovoltaic converter device (a photovoltaic converter element, a solar cell) in accordance with an embodiment of the invention.
Figure 2:
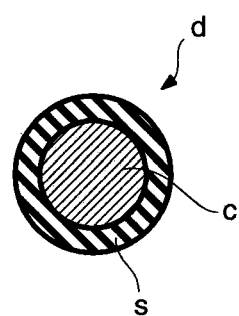
FIG. 2 is a cross-sectional view showing the structure of a quantum dot d shown in FIG. 1.

FIG. 1 is a cross-sectional view showing the structure of a quantum dot type photovoltaic converter device (a photovoltaic converter element, a solar cell) in accordance with an embodiment of the invention. FIG. 2 is a cross-sectional view showing the structure of a quantum dot d shown in FIG. 1.

The photovoltaic converter device shown in FIG. 1 is a device with a so-called pin structure, and has a structure in which a p-layer, an i-layer and an n-layer are sequentially laminated. More specifically, as shown in the figure, on a substrate 1, a transparent electrode 3, a p-type (first conductivity type) amorphous silicon layer 5, an i-layer 7, an n-type (second conductivity type) amorphous silicon layer 9, and an upper electrode 11 are sequentially laminated in layers.

The i layer (a photovoltaic conversion layer) 7 is formed from an i-type amorphous silicon layer (first material) 7a, and quantum dots (QD, nanoparticles) d contained therein in a dispersed state. The quantum dots d have a core-shell structure, as shown in FIG. 2, and have cores c composed of material in particles (second material), and shells s that coat outer circumferences of the cores. More concretely, the core c is a micro particle formed from semiconductor material (including compound semiconductor material), which is formed from an aggregation of several hundred to several million atoms. In particular, in the present application, particles having the cores c of 1 nm or greater but 20 nm or smaller in particle size are called "quantum dots." Also, the crystalline state of the cores c may be in any one of single crystalline, polycrystalline and amorphous state. As the material of the shells s that coat the cores c, any material that satisfies relations of band gaps to be described below may be selected, and for example, a dielectric material may be used. Also, the film thickness of the shells s may be, for example, 0.5 nm~10 nm, which is a film thickness in which charges (electrons or holes) within a quantum well can be tunneled through.

Relations in band gap with respect to a layer m that surrounds the quantum dots d (hereinafter this layer may be referred to as a "matrix layer" which corresponds to the i-type amorphous silicon layer 7a in FIG. 1.) are as follows. The band gap E3 of the shell s is greater than the band gap E1 of the matrix layer m, and also greater than the band gap E2 of the core c (E3>E1 and E3>E2 (see FIG. 6)). These relations will be described in detail below.

Also, as the substrate 1, for example, a light transmissive quartz glass substrate may be used. Besides this substrate, other types of glass substrates such as a soda-lime glass, resin substrates that use resin such as polycarbonate, polyethylene terephthalate and the like, and ceramics substrate may also be used.

As the transparent electrode 3, for example, indium tin oxide (ITO) in which indium is added to tin oxide may be used. Besides this, other conductive metal oxides, such as, fluorine-doped tin oxide (FTO), indium oxide (IO), tin oxide ($SnO_2$), and the like may be used. By using such a transparent electrode, light transmissivity from the rear surface side (the lower side in the figure) of the substrate 1 can be improved.

The first and second conductivity types correspond to p-type and n-type. In the case of the p-type, p-type impurity such as boron may be contained. In the case of the n-type, n-type impurity such as phosphor may be contained. The i-type (intrinsic) layer means a layer in which no impurity is injected, and has a lower impurity concentration compared to the p-type or n-type layer.

As the material for the metal electrode 11, for example, aluminum (Al) may be used. Besides this, other metal materials, such as nickel (Ni), cobalt (Co), platinum (Pt), silver (Ag), gold (Au), copper (Cu), molybdenum (Mo), titanium (Ti) and tantalum (Ta) may be used. Also, an alloy of the aforementioned metals may be used. Also, the conductive metal oxides described above may be used.

Figure 3:
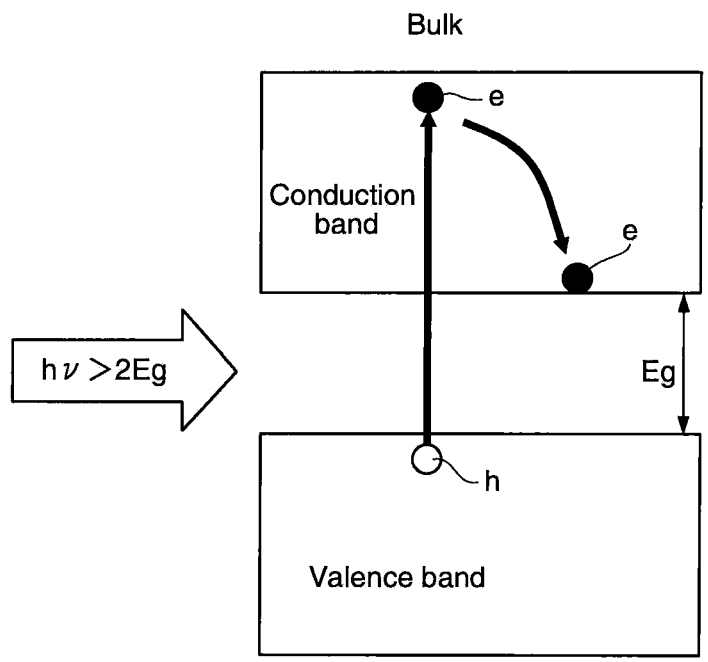
FIG. 3 shows an energy band diagram in the case of bulk material for describing the multiple exciton generation effect.
Figure 4:
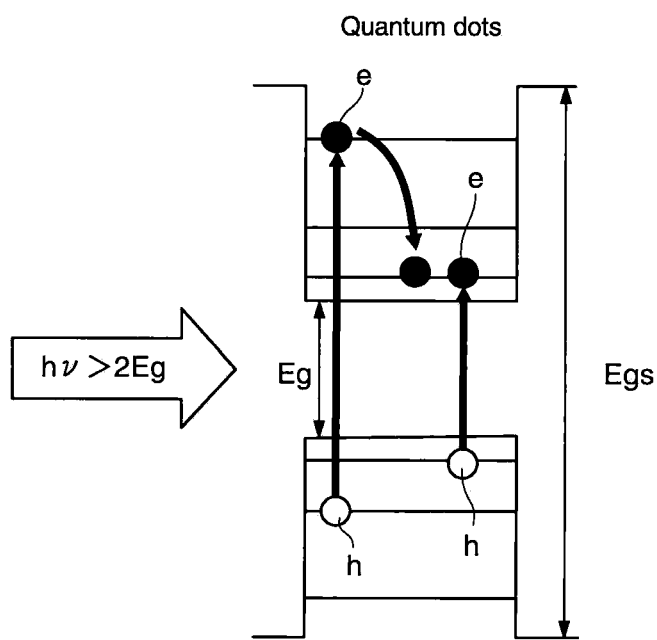
FIG. 4 shows an energy band diagram in the case of quantum dots for describing the multiple exciton generation effect.

In this manner, in accordance with the present embodiment, the quantum dots d are contained in the i-type amorphous silicon layer (the matrix layer m) 7a, such that the photovoltaic conversion efficiency can be improved. As for reasons for the improved photovoltaic conversion efficiency, it is thought to be caused by (1) the quantum size effect, and (2) the multiple exciton generation effect. These effects will be described in detail below. FIG. 3 and FIG. 4 are energy band diagrams in the case of bulk material and in the case of quantum dots, respectively, for explaining the multiple exciton generation effects. It is noted that, in the band diagrams, black dots indicate electrons (e) and white dots indicate holes (h).

(1) Quantum Size Effect

In photovoltaic conversion, electrons (carriers) that have absorbed light energy jump over a band gap Eg to move between a valence band and a conduction band, and are taken out as electrical energy (electric power). It is generally known that, the smaller the particle size of semiconductor nanoparticles, the greater the band gap becomes (see Patent Document 1). This is called the quantum size effect, whereby, for example, the band gap may be adjusted according to the ultraviolet region having greater energy in the sunlight spectrum, or specific wavelengths (for example, 400 nm~800 nm) in the visible light region and the infrared region. As a result, light can be efficiently converted into electric energy. Also, by laminating photovoltaic conversion sections having different band gaps, light with a variety of wavelength, without any limitation to the visible light region or the infrared region, can be efficiently converted into electric energy.

(2) Multiple Exciton Generation Effect (MEG)

As shown in FIG. 3, in bulk semiconductor material, carriers (electrons), upon receiving light energy (E=hv=hc/λ, h: Planck's constant, v: frequency, c: light speed, and λ: wavelength), transfer to the conduction band, and taken out as electric energy. When the light energy hv is greater than the band gap Eg (hv>Eg), carriers may transfer to the upper state of the conduction band, but moves to the bottom state of the conduction band which is more stable as a portion of the energy that exceeds Eg quickly moves to the lattice system as heat. In other words, the energy that exceeds Eg is lost as heat. Accordingly, only one carrier can be generated by one photon. It is noted that a hole remains for the excited electron, and a pair thereof is called an exciton.

In contrast, as shown in FIG. 4, when quantum dots d are used, a quantum well is formed by a difference (Egs>Eg) between the band gap Eg of the quantum dot d and a band gap Egs of a layer surrounding the quantum dot d (which corresponds to the shell s in the case of the quantum dot d with a core-shell structure). The quantum well three-dimensionally restricts moving directions of electrons. Also, electron orbitals formed in the quantum well are not continuous. For this reason, in the case of the light energy hv being greater than the band gap Eg (hv>Eg), when an electrons excited to the upper orbital drops to the upper edge of the band gap, the relaxation process that gives energy to the lattice system as heat becomes very slow. As a result, interaction with other electrons in the same quantum well become relatively stronger, by which the probability of giving energy to other electrons by one electron dropping to the upper edge of the band gap becomes greater. At this moment, if the light energy hv is two times the band gap Eg or greater (hv>2Eg), more electrons can jump the band gap and generate excitons. Therefore, multiple carriers (for example, electrons) can be generated by one photon. Accordingly, the photovoltaic conversion efficiency can be improved as they are retrieved as a current.

As described above in detail with reference to the paragraphs (1) and (2), the photovoltaic conversion efficiency can be improved by inclusion of quantum dots d.

Figure 5:
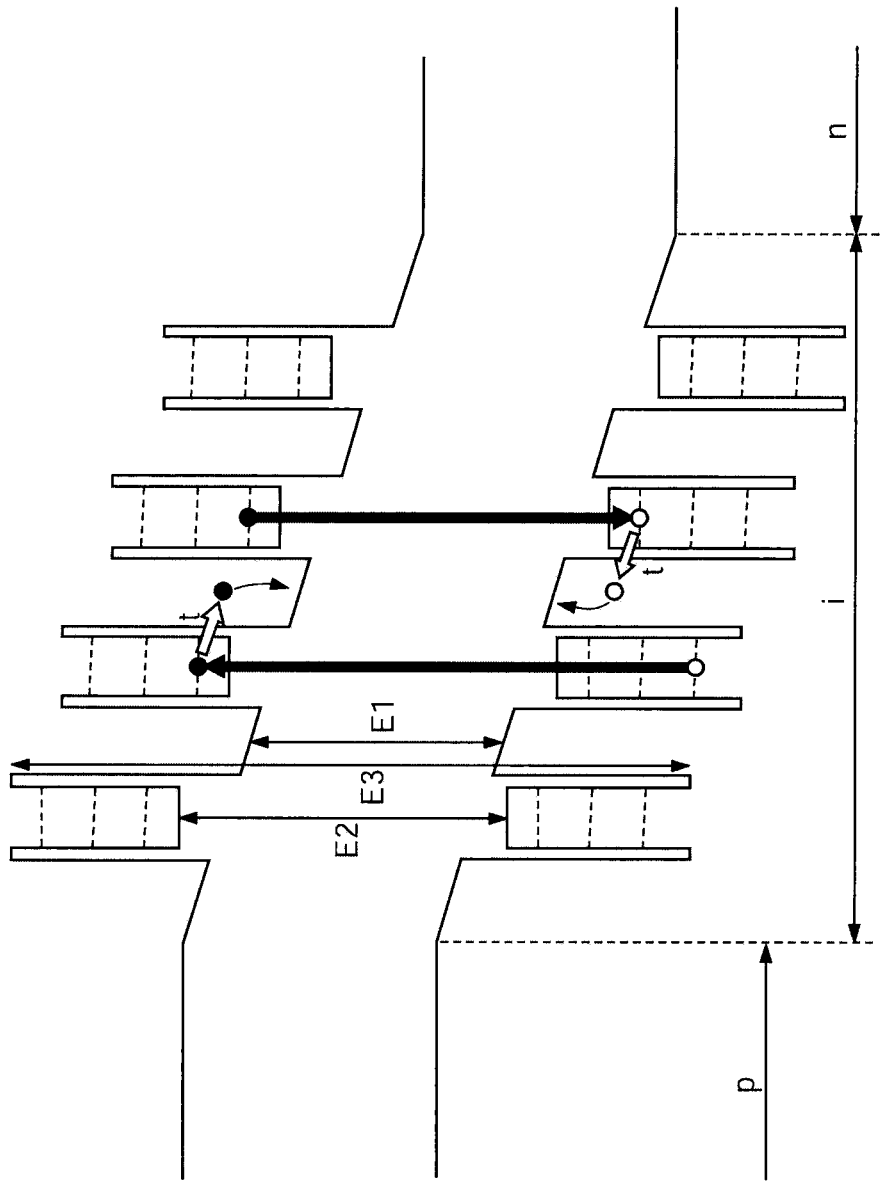
FIG. 5 shows an energy band diagram of a photovoltaic converter device in accordance with an embodiment of the invention.
Figure 6:
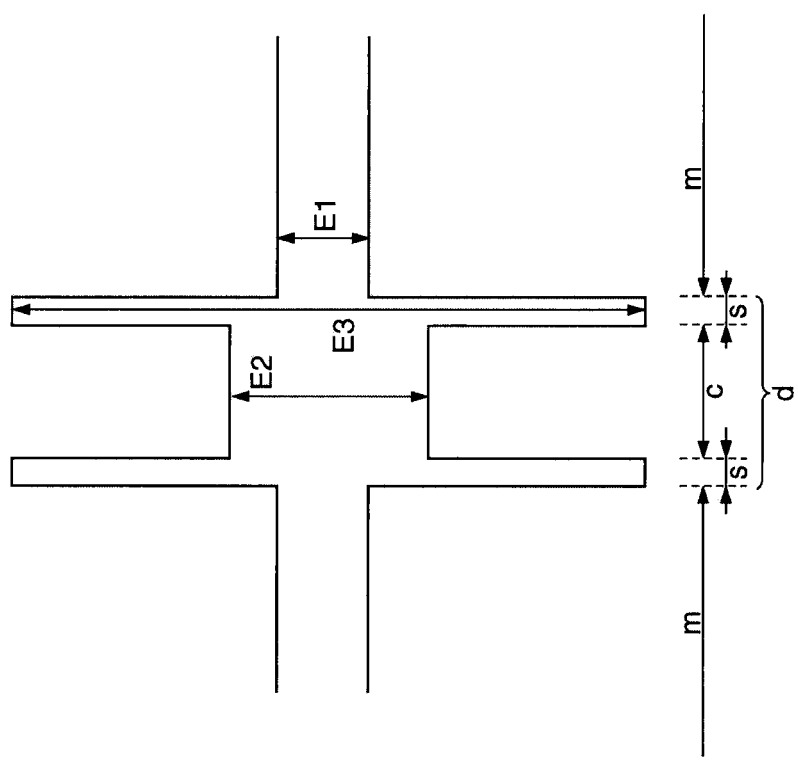
FIG. 6 shows an energy band diagram of one quantum dot and its neighboring area.
Figure 7:
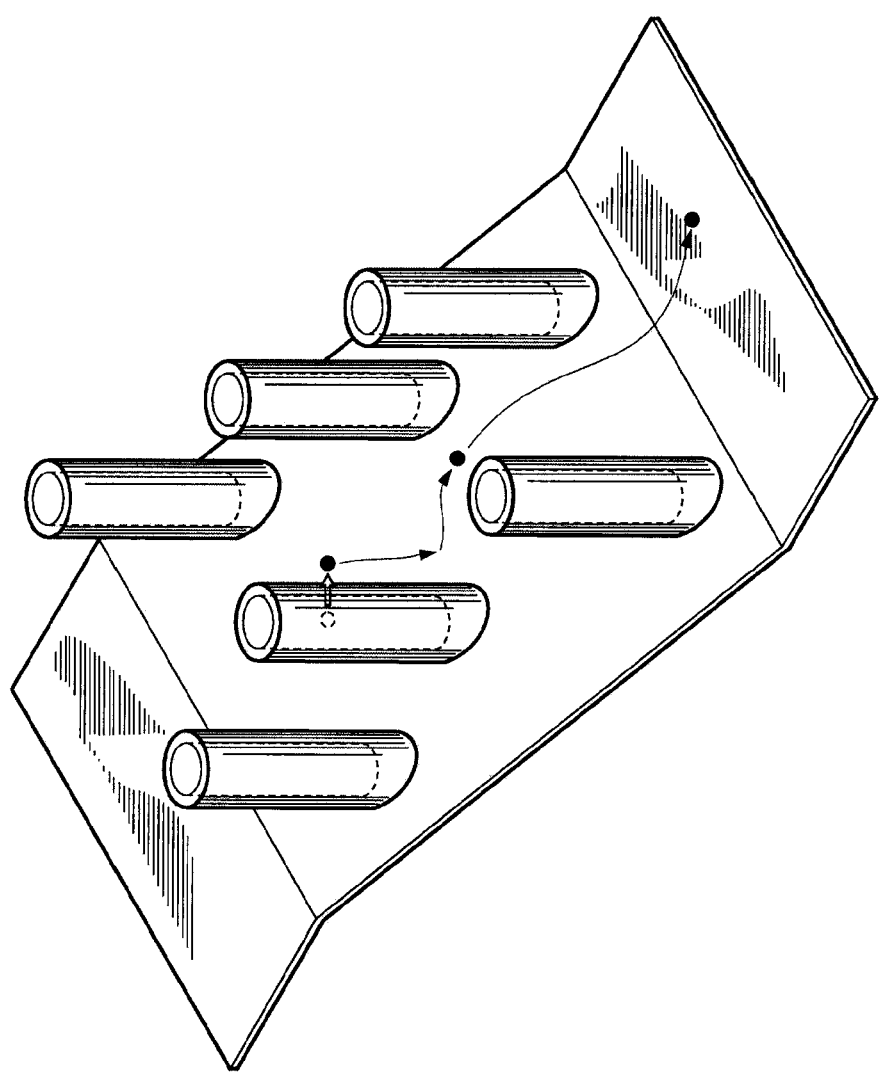
FIG. 7 schematically shows an energy band diagram of the photovoltaic converter device in accordance with the present embodiment.
Figure 8:
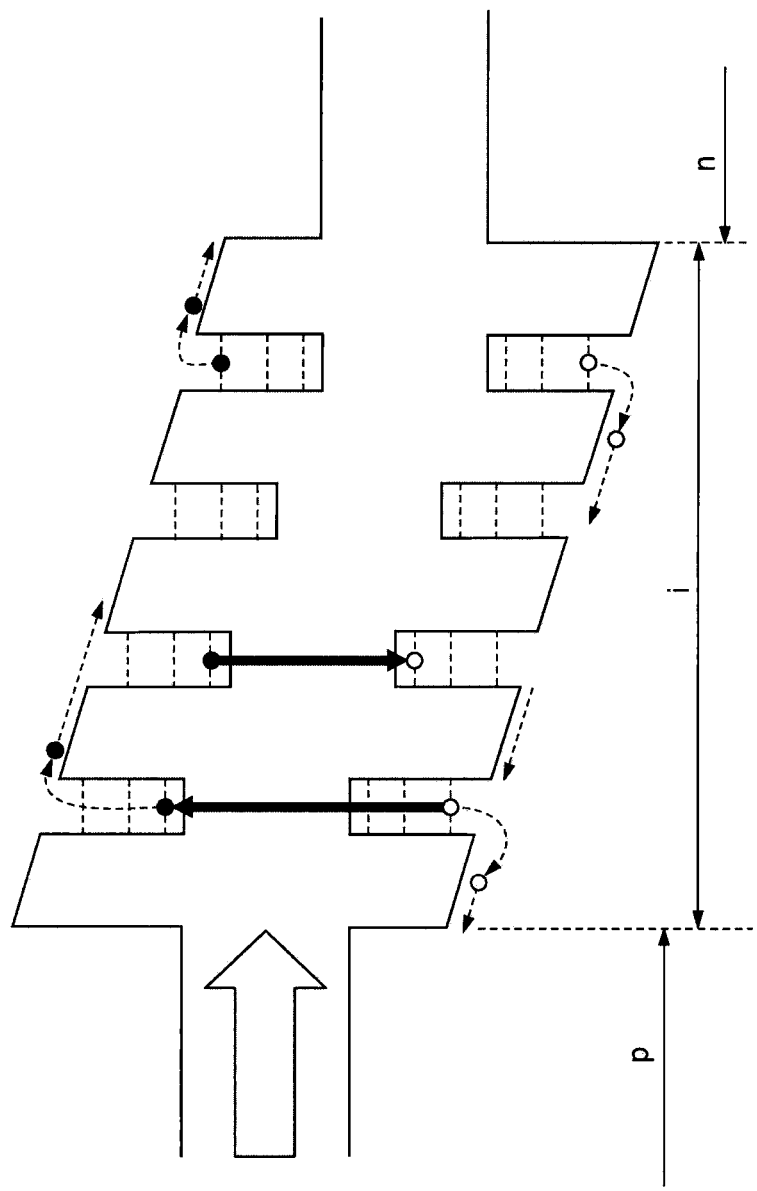
FIG. 8 shows an energy band diagram of a photovoltaic converter device (an example for comparison) in which its matrix layer is composed of silicon oxide ($SiO_2$).
Figure 9:
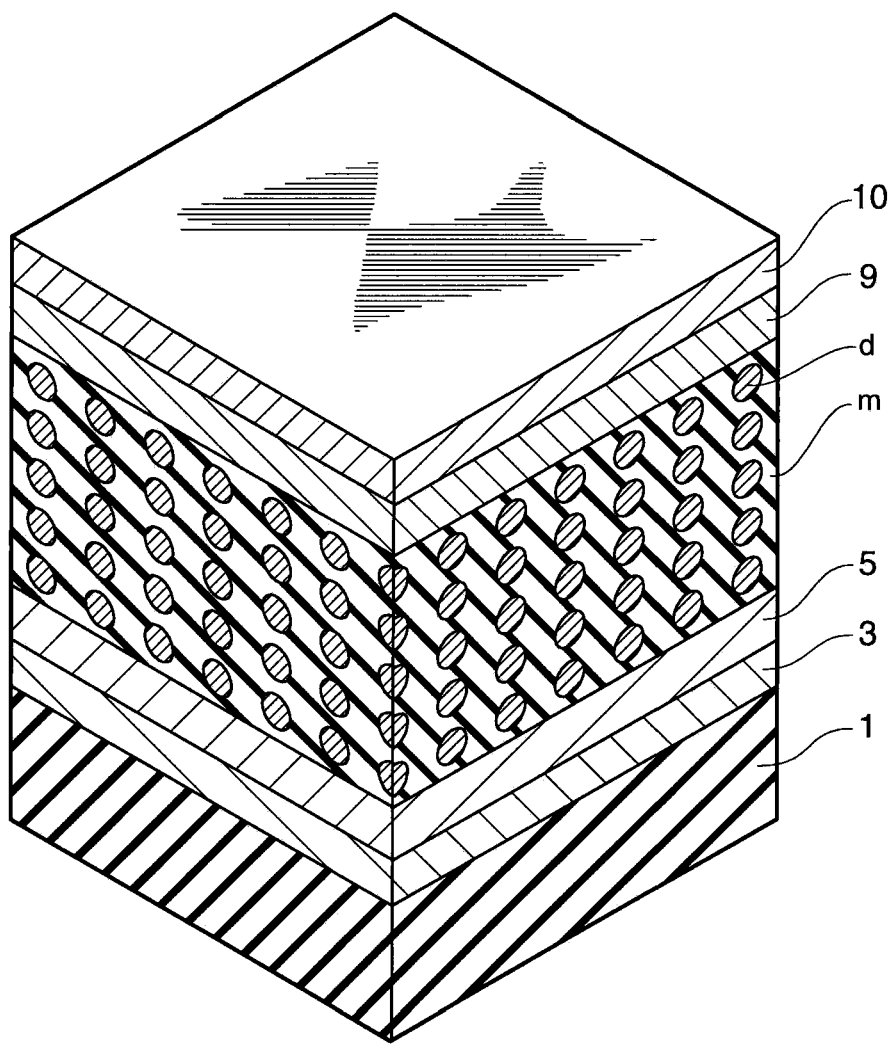
FIG. 9 is a cross-sectional perspective view schematically showing a super lattice structure.
Figure 10:
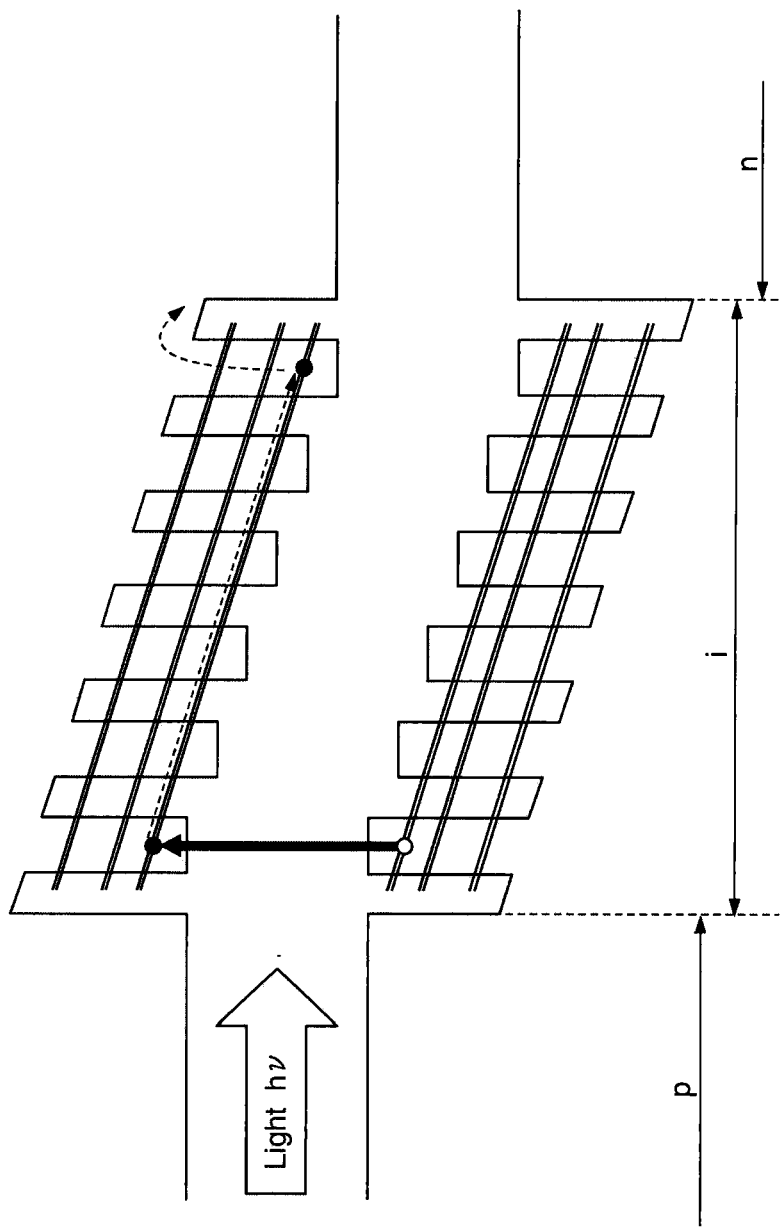
FIG. 10 shows an energy band diagram when mini-bands are formed.

Furthermore, in accordance with the present embodiment, quantum dots d with a core-shell structure are used so that the relation in band gap between the matrix layer m (E1), the core c (E2) and the shell s (E3) is set to E3>E1 and E3>E2, whereby electric charge can be transferred from a quantum well to the exterior of the shell s by the tunneling effect, and therefore the electric charge can be readily retrieved to the exterior of the shell s, in other words, through the matrix layer m. As a result, the photovoltaic conversion efficiency can be further improved. The effects will be described with reference to FIGS. 5 through 10. FIG. 5 shows an energy band diagram of a photovoltaic converter device in accordance with an embodiment of the invention. FIG. 6 shows an energy band diagram of one quantum dot and its neighboring area. FIG. 7 schematically shows an energy band diagram of the photovoltaic converter device in accordance with the present embodiment. FIG. 8 shows an energy band diagram of a photovoltaic converter device (an example for comparison) in which its matrix layer is composed of silicon oxide ($SiO_2$). FIG. 9 is a cross-sectional perspective view schematically showing a super lattice structure. FIG. 10 shows an energy band diagram when mini-bands are formed.

As shown in FIG. 5 and FIG. 6, in the photovoltaic converter device in accordance with the present embodiment, a quantum well is formed by a band gap difference between the core c (E2) and the shell s (E3). Also, a tunnelable barrier can be formed by a band gap difference between the relatively thin core c (E2) and the matrix layer m (E1).

Therefore, as shown in FIG. 5, a charge (electron or hole) transferred within the quantum well is discharged outside the core c by tunneling through the aforementioned barrier (an arrow t). The matrix layer m outside the core c has an internal electric field formed by a pin structure, such that the discharged electron or hole moves toward the n layer or the p layer due to the internal electric field, whereby an electric charge can be retrieved. It is noted that FIG. 5 illustrates another quantum well being present next to the tunneled charge, which appears to be presented as a barrier against the charge transfer. However, if the cross section of the pin structure is viewed two-dimensionally, no barrier exists, as shown in FIG. 7, such that the electric charge can readily flow through the matrix layer between the quantum wells. In this instance, the electric charge may have some scattering due to the shells of other quantum dots, but would not be trapped by the cores of the other quantum dots. In the case of such a structure, mini-bands do not need to be formed by regularly arranging quantum dots, as described below, and deviations in the size of quantum dots would scarcely pose particular problems, which is advantageous compared to the comparison example to be described below.

In contrast, when quantum dots having only core sections c without shell sections s are placed in a matrix layer composed of the material of the shells s (for example, a film of silicon oxide $SiO_2$) (a comparison example in FIG. 8), the thick matrix layer m is present between quantum wells, such that the probability of occurrence of the tunneling phenomenon is extremely low. If the core sections c are to be very densely arranged, the thickness of the matrix layer m between the core sections c becomes sufficiently thin, whereby tunneling would more readily occur. But, even in this case, in order to retrieve an electron-hole pair generated in the core section c to the n-layer and the p-layer, tunneling needs to be repeated many times, and the retrieval thereof is in effect difficult. Also, generated charges (electrons or holes) have an extremely low probability to exceed the quantum well by thermal excitation or the like to pass through the quantum well to the outside thereof.

For this reason, according to the researches so far made, as shown in FIG. 9, it has been proposed to provide a structure (a super lattice) in which quantum dots d are regularly arranged in length and breadth directions and up and down directions in a matrix layer ($SiO_2$) m, thereby retrieving excited charges outside through mini-bands, as shown in FIG. 10. However, it is not easy to regularly arrange quantum dots d.

In contrast, in accordance with the present embodiment, as described above, quantum dots d with a core-shell structure, an electric charge within a quantum well can be retrieved by tunneling only once through the energy barrier created by the shell s, whereby the photovoltaic conversion efficiency can be improved with a simple composition.

Figure 11:
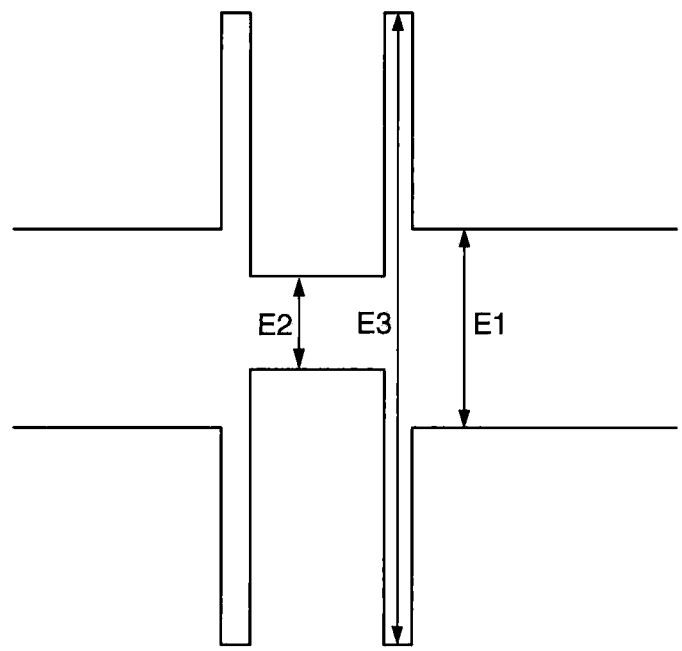
FIG. 11 shows another energy band diagram of one quantum dot and its neighboring area.
Figure 12:
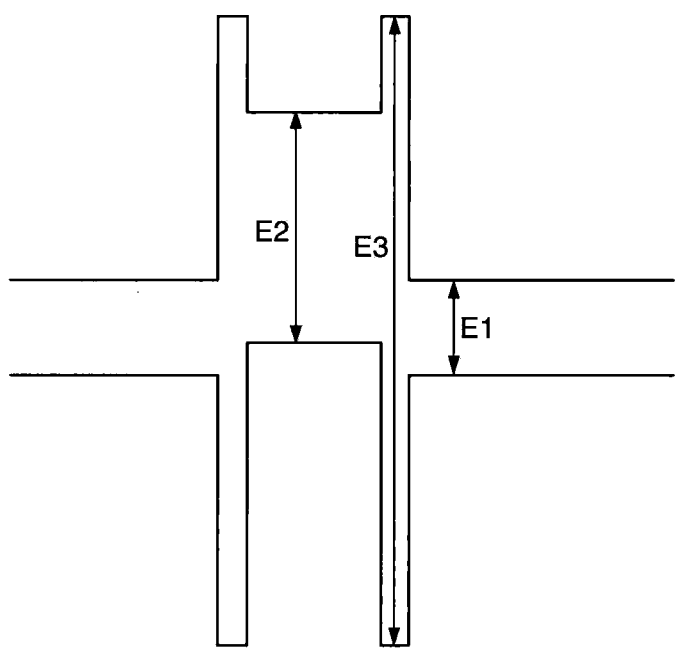
FIG. 12 shows still another energy band diagram of one quantum dot and its neighboring area.

FIG. 11 and FIG. 12 are other energy band diagrams of one quantum dot and its neighboring area. In FIG. 6, the band gaps of the core c (E2) and the matrix layer m (E1) are set to be E2>E1. However, without being limited to this relation, the band gaps thereof can be, for example, E2<E1 as shown in FIG. 11, or E2=E1. Also, as shown in FIG. 12, the quantum wells may have different depths in a vertical direction (on the electron side and the hole side), as long as the relation of E3>E1 and E3>E2 is satisfied. However, the energy barrier E3 of the shell s surrounding the quantum well may preferably be two times E2 or greater. In this case, multiple exciton generation (MEG) would more readily occur, and therefore the photovoltaic conversion efficiency can be further improved.

Also, the material for the cores, the material for the shells and the material for the matrix layer are not particularly limited to any materials as long as they satisfy the relation between the band gaps. However, it is preferred that semiconductor materials having substantially the same band gaps may be used as the material for the cores and the material for the matrix layer, and wide gap semiconductor materials with a band gap being 3 eV or greater or dielectric materials may be used as the material for the shells. Also, the band gap for the material for the shells may preferably be two times the band gap of the material for the cores or greater. Also, it is preferred that, as the material for the cores, a semiconductor material having an absorption coefficient as large as possible among the semiconductor materials may be used and, as the material for the matrix layer, a semiconductor material having an absorption coefficient as small as possible (at least smaller than that of the material for the cores) may be used. In this case, the light absorption coefficient at the core becomes greater than the light absorption coefficient at the matrix layer, such that light absorption at the core prevails. Accordingly, excitation of electric charge and probability of MEG increase at the core, whereby the photovoltaic conversion efficiency can be improved.

FIG. 13 shows, as an example, a table of materials usable as the material for the cores, the material for the shells and the material for the matrix of the photovoltaic converter device in accordance with the present embodiment. A prefix "a-" indicates amorphous, and a prefix "c-" indicates crystalline (including single crystalline, polycrystalline, microcrystalline).

As shown in the figure, as the materials usable for the cores, a-Si, c-Si, a-Ge, c-Ge, PbS, PbSe, GaAs, ZnSe, and β-GeSi$_2$ may be used. As the materials usable for the shells, films of dielectric material, such as, SiO$_2$, SiN and SiON, wide gap semiconductor materials, such as, SiC and GaN, and light transmissive conductive films, such as, ITO, FTO, ATO (antimony doped tin oxide), ZnO and SnO$_2$ may be used, and also semiconductor materials with a band gap (Eg) being 3 eV or greater or dielectric materials may be used. Furthermore, as the materials for the matrix layer, a-Si and c-Si may be used. It is noted that c-Si includes those of single crystalline, polycrystalline (poly-Si) and microcrystalline (μc-Si)

As preferred combinations of these materials, for the core material/the matrix material, any one of "Ge, PbS, PbSe and β-FeSi$_2$" for the former and one of c-Si and a-Si for the latter may be used. In addition, a combination of a-Si for the former and one of c-Si and a-Si for the latter may be used. Moreover, a combination of c-Si with grain size being 3 μm or less for the former and c-Si for the latter may be used.

Method For Manufacturing Photovoltaic Converter Device

Figure 14A:
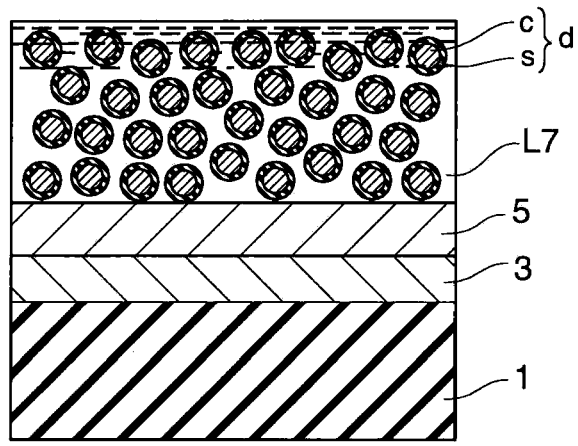
FIGS. 14A-14C are cross-sectional views showing steps of manufacturing a photovoltaic converter device in accordance with an embodiment of the invention.
Figure 14B:
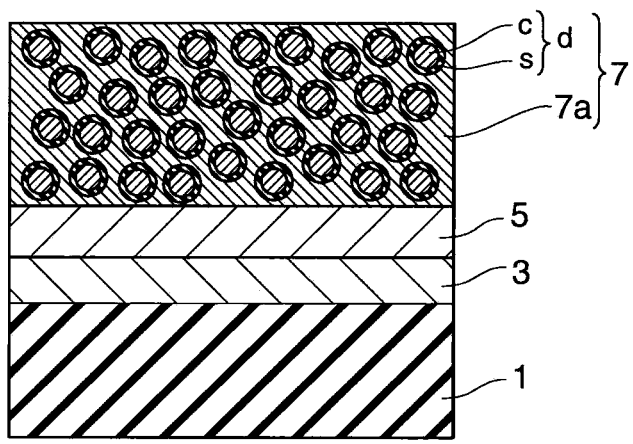
Figure 14C:
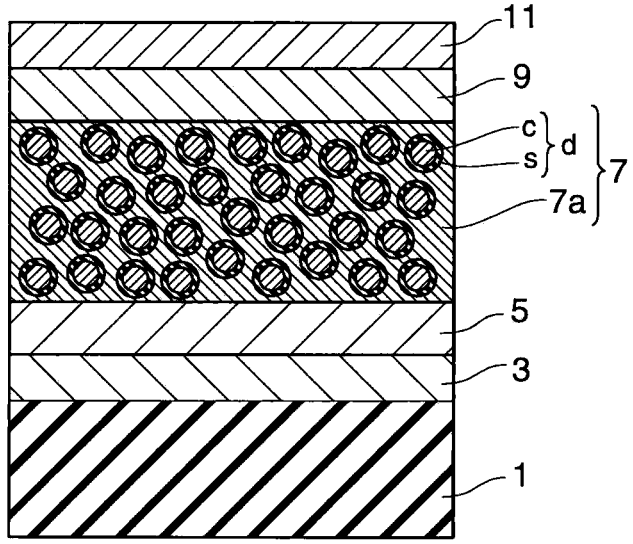

Next, a method for manufacturing the above-described photovoltaic converter device will be described. For example, the photovoltaic converter device using Ge as the material for the cores, SiO$_2$ as the material for the shells and amorphous silicon as the material for the matrix layer will be described as an example. FIGS. 14A-14C are cross-sectional views showing steps of manufacturing the photovoltaic converter device in accordance with the present embodiment.

As shown in FIG. 14A, for example, a quartz glass substrate is prepared as the substrate 1, and an ITO film is deposited on the substrate 1 by a sputtering method, and thereafter may be patterned according to requirements to form a transparent electrode 3.

Then, a p-type amorphous silicon layer 5 is formed on the transparent electrode 3. For example, an impurity added precursor liquid in which p-type impurity such as boron is added in a silicon precursor liquid (liquid silicon material) may be used to form the layer 5. The "precursor liquid" refers to a precursor material for obtaining a specified material, and refers here to a liquid silicon material for obtaining a silicon layer. As the silicon precursor liquid, for example, a solution liquid in which a polysilane obtained through polymerization by irradiating cyclopentasilane (Si$_5$H$_{10}$) with ultraviolet light is dissolved in an organic solvent can be used. The impurity added precursor liquid is coated on the transparent electrode 3 by a spin coat method. Then, a heat treatment is conducted to amorphousize (solidify, sinter) the coated material. It is noted that, besides the spin coat method, other jetting methods such as, a spray method, an ink jet method and the like may be used.

Then, a silicon precursor liquid L7 containing quantum dots d dispersed therein is prepared, and coated on the p-type amorphous silicon layer 5. As the liquid silicon material, the above-described polysilane solution may be used. Also, as the quantum dots 4, quantum dots d having a core-shell structure in which, for example, nanocrystals of germanium (Ge) are coated on their outer circumferences with SiO$_2$ may be used. Core portions and their outer circumference shell portions of the quantum dots may be manufactured by, for example, a molecular beam epitaxy, a chemical vapor deposition, a gas-evaporation deposition, a hot soap method, a colloidal wet chemical method or the like. For example, liquid containing quantum dots with a core-shell structure dispersed therein is manufactured and sold by Quantum Dot Corporation and Evident Technologies Inc.

Such quantum dots d with a core-shell structure may be manufactured or obtained, and dispersed in the silicon precursor liquid described above. Then, the silicon precursor liquid L7 containing the quantum dots d is coated on the p-type amorphous silicon layer 5 by a spin coat method. Then, heat treatment is conducted to amorphousize the coated material. It is noted that, besides the spin coat method, other jetting methods such as a spray method, an ink jet method or the like may be used. By this, an i-type amorphous silicon layer 7a containing the quantum dots d with a core-shell structure in a dispersed state is formed (FIG. 14B).

Next, as shown in FIG. 14C, an n-type amorphous silicon layer 9 is formed on the i-type amorphous silicon layer 7a. For example, this can be formed by using a silicon precursor liquid (for example, the polysilane solution described above) with n-type impurity such as yellow phosphorous (P$_4$) added therein. The precursor liquid is coated on the i-type amorphous silicon layer 7a by a spin coat method, and heat treated to amorphousize the coated material.

It is noted that the p-type and n-type amorphous silicon layers (5 and 9) may be formed by a chemical vapor deposition (CVD) method. Also, impurities may be injected by an ion injection method. Furthermore, the layers (5, 7 and 9) each being in a coated and dried state may be laminated, and sintered together.

Then, an Al film is formed as a metal electrode 11 on the n-type amorphous silicon layer 9. For example, Al may be deposited on the n-type amorphous silicon layer 9 by a sputtering method, and patterned according to requirements to form the metal electrode 11. By the steps described above, the photovoltaic converter device in accordance with the present embodiment is formed.

It is noted that the method of manufacturing a photovoltaic converter device in accordance with the present embodiment is not limited to the method described above. However, according to the manufacturing process described above, the i-layer is formed by using a semiconductor precursor liquid containing quantum dots dispersed therein, such that the photovoltaic converter device can be readily formed. Also, the photovoltaic converter device can be manufactured at low cost.

In accordance with the present embodiment, cyclopentasilane (Si$_5$H$_{10}$) is used as the silicon precursor liquid, but other silicon compounds that are polymerized may be used.

Electronic Apparatus

The photovoltaic converter device described above may be incorporated in a variety of electronic apparatuses. There is no limitation to applicable electronic apparatuses, and some examples thereof are described below.

Figure 15:
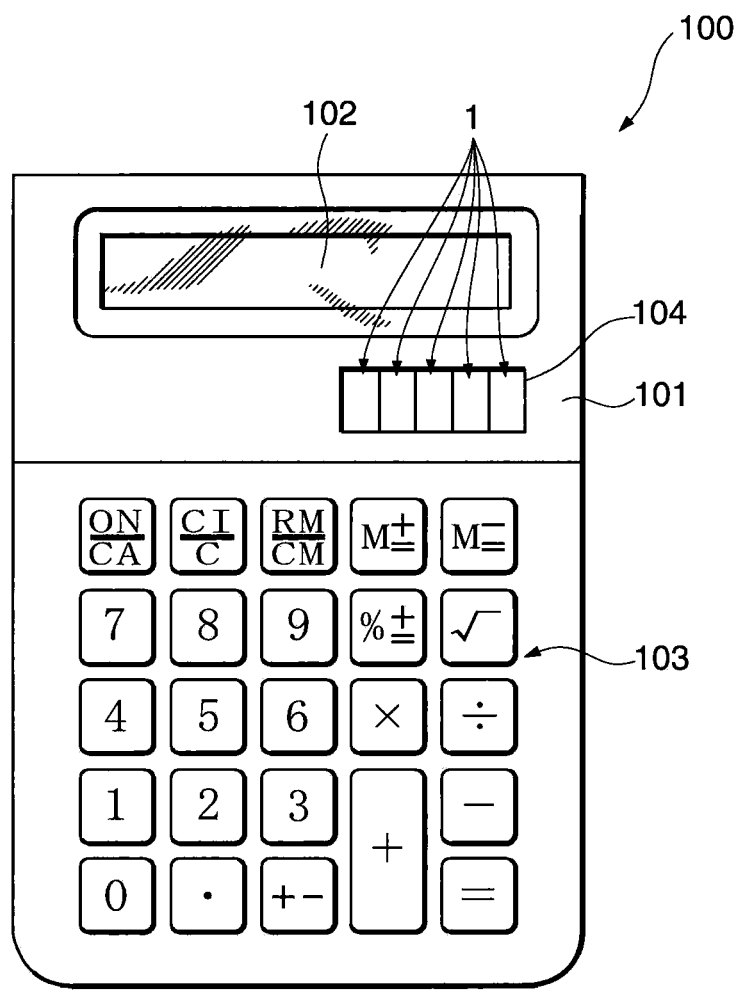
FIG. 15 is a plan view of a calculator using a solar cell (a photovoltaic converter device).
Figure 16:
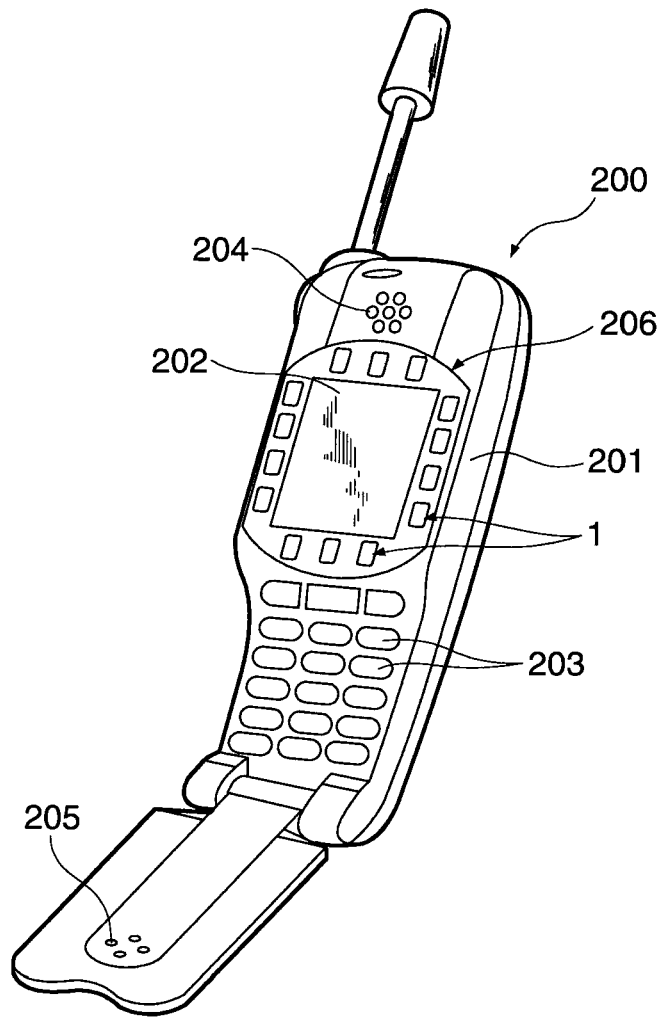
FIG. 16 is a perspective view of a cell phone using a solar cell (a photovoltaic converter device).

FIG. 15 is a plan view of a calculator using a solar cell (a photovoltaic converter device) in accordance with the present invention. FIG. 16 is a perspective view of a cell phone (including a PHS) using a solar cell (a photovoltaic converter device) in accordance with the present invention.

A calculator 100 shown in FIG. 15 is equipped with a main body section 101, a display section 102 provided on an upper surface (front face) of the main body section 101, a plurality of operation buttons 103, and a photovoltaic conversion element arranged section 104.

The composition shown in FIG. 15 includes five photovoltaic conversion elements 1 connected in series and arranged in the photovoltaic conversion element arrangement section 104. As the photovoltaic conversion elements 1, the photovoltaic converter devices described above can be incorporated.

A cell phone 200 shown in FIG. 16 is equipped with a main body section 201, a display section 202 provided on a front face of the main body section 201, a plurality of operation buttons 203, a receiver section 204, a transmitter section 205 and a photovoltaic conversion element arranged section 206.

In the composition shown in FIG. 16, the photovoltaic conversion element arranged section 206 is provided in a manner to surround the display section 202, and a plurality of the photovoltaic conversion elements 1 are connected in series and arranged therein. As the photovoltaic conversion elements 1, the photovoltaic converter devices described above can be incorporated.

In addition to the calculator shown in FIG. 15 and the cell phone shown in FIG. 16, the electronic apparatus in accordance with the invention may also be applicable, for example, to photo sensors, photo switches, electronic notebooks, electronic dictionaries, wrist watches, clocks and the like.

Figure 17:
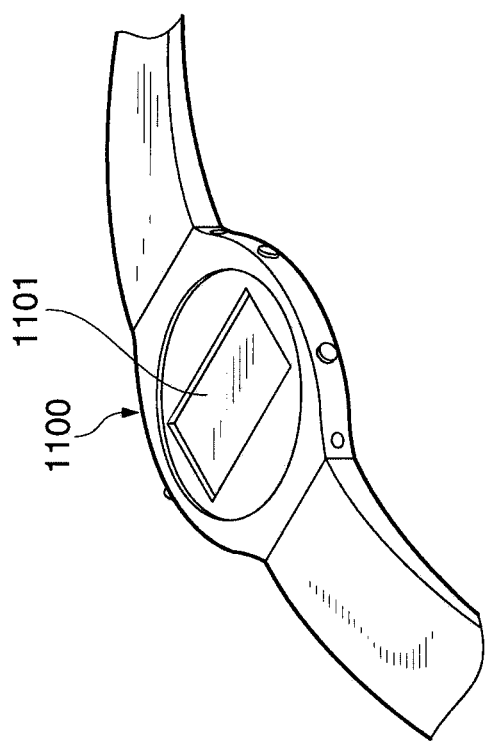
FIG. 17 is a perspective view of a wrist watch that is an example of an electronic apparatus.

FIG. 17 is a perspective view of a wrist watch that is an example of an electronic apparatus. The wrist watch 1100 is equipped with a display section 1101 and, for example, the photovoltaic converter device described above may be incorporated around the circumference of the display section 1101.

Also, the photovoltaic converter device described above is suitable for cost saving and mass production, and is also suitable for use in home or business solar generator systems.

It is noted that the embodiment examples and the application examples described with reference to the embodiments may be appropriately combined or may be used with modifications or improvements added thereto according to different uses, and the invention is not limited to the descriptions of the above-described embodiments.

What is claimed is:

1. A photovoltaic converter device comprising:
a first material layer having a first material; and
a plurality of particles, the plurality of particles dispersing among the first material, each of the plurality of particles including a second material and a third material, the second material being covered by the third material,
wherein the first material has a band gap E1, the second material has a band gap E2, the third material has a band gap E3, the band gap E3 is greater than the band gap E1, and the band gap E3 is greater than the band gap E2,
a carrier generated at the second material is extracted to the first material through the third material by a tunneling effect,
the second material is at least one material selected from the group consisting of c-Ge, a-Ge, PbS, PbSe, GaAs, ZnSe, $\beta$-GeSi$_2$, and $\beta$-FeSi$_2$, and
the third material is at least one material selected from the group consisting of ITO, FTO, and ATO.

2. The photovoltaic converter device according to claim 1, each of the plurality of particles having a core of 1 nm or greater but 20 nm or smaller.

3. The photovoltaic converter device according to claim 1, the third material including a dielectric.

4. The photovoltaic converter device according to claim 1, the second material including one of Ge, PbS and PbSe.

5. The photovoltaic converter device according to claim 1, the first material including one of amorphous silicon, microcrystalline silicon, polycrystalline silicon, and single crystal silicon, or a complex material thereof.

6. The photovoltaic converter device according to claim 1, the second material having an absorption coefficient greater than an absorption coefficient of the first material.

7. The photovoltaic converter device according to claim 1, further comprising a p-type semiconductor layer and an n-type semiconductor layer,
the first material being disposed between the p-type semiconductor layer and the n-type semiconductor layer.

8. An electronic apparatus, comprising:
a power source, the power source including the photovoltaic converter device according to claim 1.

9. An electronic apparatus, comprising:
a power source, the power source including the photovoltaic converter device according to claim 2.

10. An electronic apparatus, comprising:
a power source, the power source including the photovoltaic converter device according to claim 3.

11. An electronic apparatus, comprising:
a power source, the power source including the photovoltaic converter device according to claim 4.

12. An electronic apparatus, comprising:
a power source, the power source including the photovoltaic converter device according to claim 5.

13. An electronic apparatus, comprising:
a power source, the power source including the photovoltaic converter device according to claim 6.

14. An electronic apparatus, comprising:
a power source, the power source including the photovoltaic converter device according to claim 7.

* * * * *